United States Patent
Schuster et al.

(10) Patent No.: US 7,009,397 B2
(45) Date of Patent: Mar. 7, 2006

(54) MAGNETIC RESONANCE APPARATUS WITH A GRADIENT COIL SYSTEM STRUCTURED FOR REDUCED NOISE EMISSION

(75) Inventors: Johann Schuster, Oberasbach (DE); Stefan Stocker, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 10/679,042

(22) Filed: Oct. 3, 2003

(65) Prior Publication Data
US 2004/0113619 A1 Jun. 17, 2004

(30) Foreign Application Priority Data
Oct. 4, 2002 (DE) .............................. 102 46 309

(51) Int. Cl.
*G01V 3/00* (2006.01)
(52) U.S. Cl. ....................................... 324/318; 324/319
(58) Field of Classification Search ................. 324/309, 324/318, 322, 319; 335/299; 5/601
See application file for complete search history.

(56) References Cited

U.S. PATENT DOCUMENTS

| | | | |
|---|---|---|---|
| 4,956,885 A * | 9/1990 | Alich et al. .................... | 5/601 |
| 5,084,676 A * | 1/1992 | Saho et al. .................. | 324/318 |
| 5,185,576 A * | 2/1993 | Vavrek et al. .............. | 324/318 |
| 5,296,810 A * | 3/1994 | Morich ........................ | 324/318 |
| 6,107,799 A | 8/2000 | Sellers et al. ................ | 324/318 |
| 6,154,110 A * | 11/2000 | Takeshima ................... | 335/299 |
| 6,208,144 B1 * | 3/2001 | McGinley et al. ........... | 324/319 |
| 6,346,816 B1 * | 2/2002 | Damadian et al. .......... | 324/318 |
| 6,456,074 B1 * | 9/2002 | Minas ......................... | 324/318 |
| 6,531,870 B1 | 3/2003 | Heid et al. .................. | 324/318 |
| 6,842,005 B1 * | 1/2005 | Schuster ..................... | 324/318 |
| 6,933,723 B1 * | 8/2005 | Schulz et al. ............... | 324/318 |
| 2004/0113618 A1 * | 6/2004 | Schuster ..................... | 324/318 |
| 2004/0113619 A1 * | 6/2004 | Schuster et al. ............ | 324/318 |
| 2005/0040826 A1 * | 2/2005 | Renz et al. ................. | 324/319 |
| 2005/0083057 A1 * | 4/2005 | Schulz et al. ............... | 324/318 |

FOREIGN PATENT DOCUMENTS

DE   0 362 931 A2   11/1990

* cited by examiner

*Primary Examiner*—Diego Gutierrez
*Assistant Examiner*—Tiffany A. Fetzner
(74) *Attorney, Agent, or Firm*—Schiff Hardin LLP

(57) ABSTRACT

A magnetic resonance device HAS a cavity and with a gradient coil system arranged in the cavity, that, in a middle region, exhibits a lower mechanical stiffness than in edge regions connected to the middle region, and has a supporting arrangement to support the middle region against a boundary surface of the cavity.

16 Claims, 2 Drawing Sheets

MAGNETIC RESONANCE APPARATUS WITH A GRADIENT COIL SYSTEM STRUCTURED FOR REDUCED NOISE EMISSION

BACKGROUND OF THE INVENTION

1. Field of the Invention

The invention concerns a magnetic resonance device of the type having a cavity and with a gradient coil system arranged in the cavity.

2. Description of the Prior Art

Magnetic resonance technology is a known technology for, among other things, acquiring images of the inside of a body of an examination subject. In a magnetic resonance device, rapidly switched gradient fields that are generated by a gradient coil system are superimposed on a static basic magnetic field that is generated by a basic field magnet. The magnetic resonance device also has a radio-frequency system that emits radio-frequency signals into the examination subject to excite magnetic resonance signals and acquires the excited magnetic resonance signals, on the basis of which magnetic resonance images are generated.

To generate gradient fields, appropriate currents must be adjusted in gradient coils of the gradient coil system. The amplitudes of the required currents can be up to more than 100 A. The current rise and fall rates can be more than 100 kA/s. The existing basic magnetic field, on the order of 1 T, interacts with these temporally changing currents in the gradient coil to produce Lorentz forces, which leads to oscillations of the gradient coil system. These oscillations are transmitted over various propagation paths at the surface of the magnetic resonance device. The mechanical oscillations are thereby transduced into sound vibrations that subsequently lead to undesired noise. Furthermore, the Lorentz forces can lead to an undesired rigid-body motion (resonance) of the gradient coil system with regard to the rest of the magnetic resonance device.

A magnetic resonance device is known from German OS 197 22 481 in which a basic field magnet has a first surface and a gradient coil system has a second surface, the surfaces facing one another being separated from one another, and a noise reduction device is arranged in contact with both surfaces to damp the oscillations of the gradient coil system and/or to stiffen or reinforce the gradient coil system. In an embodiment, to form a closed, sealed space between the two surfaces, the noise reduction device has suitable seals, this space being filled with sand, foam, a fluid under pressure, or other oscillation damping and/or stiffening materials. In another embodiment, the noise reduction device has a number of cushions that can be filled with one of the aforementioned materials. In another embodiment, in a basic field magnet having a cylindrical, hollow opening, in which a hollow-cylindrical gradient coil system is arranged, the noise reduction device is formed by wedges that are distributed between the two surfaces.

A magnetic resonance device with a gradient coil system is known from European Application 0 362 931 wherein the gradient coil system is fashioned of two units forming the gradient coils that are separate from one another are attached to a coil tube that projects on both sides from a cylindrical cavity of a basic field magnet of the magnetic resonance device, and is independently connected by the basic field magnet with its own supporting frame with the surroundings assembly of the magnetic resonance device.

A magnetic resonance device with a gradient coil system is known from German OS 101 56 770, in which an electrically conductive structure is arranged and fashioned such that a magnetic field of the structure caused by a gradient field by induction is similar to the gradient field, at least within the imaging volume of the magnetic resonance device. In an embodiment, a part of the structure is fashioned substantially barrel-shaped as a component of the basic field magnet. Among other things, the gradient coil system can be fashioned without shielding coils, since the undesired consequences of the switched gradient fields, due to the similarity of the magnetic field caused by the structure, can be completely controlled by a pre-emphasis (pre-distortion/deformation).

SUMMARY OF THE INVENTION

An object of the present invention is to provide an improved magnetic resonance device in which, in particular, a gradient coil system that exhibits non-uniform stiffness can be securely and quietly attached in the magnetic resonance device.

The object is achieved in accordance with the present invention in a magnetic resonance device with a cavity, and with a gradient coil system arranged in the cavity that exhibits a lower mechanical stiffness in a middle region than in the edge regions connected to the middle region, and a supporting arrangement that supports the middle region against a boundary surface of the cavity.

The gradient coil system that are mechanically weaker in the middle region can be installed in the magnetic resonance device such that a high stiffness is achieved for the entire system, which results in a reduced noise emission of the magnetic resonance device.

DESCRIPTION OF THE PREFERRED EMBODIMENTS

Figure 1:
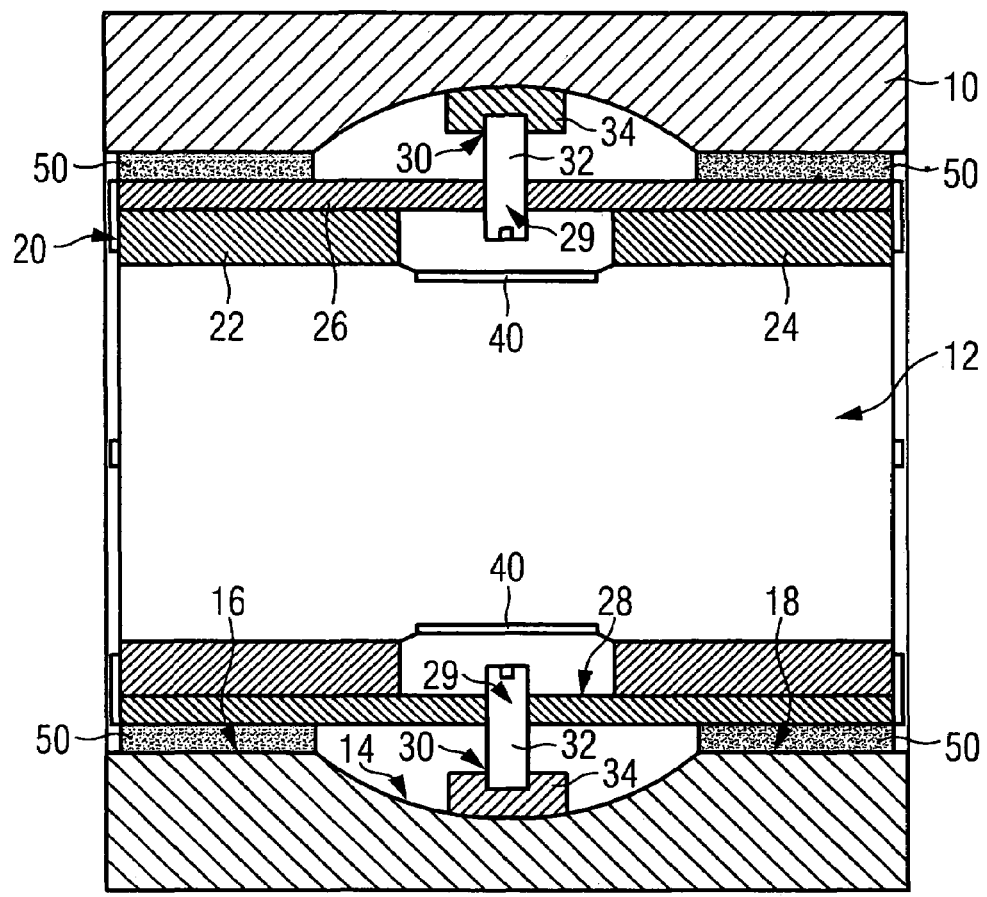
FIG. 1 is a longitudinal section through a magnetic resonance device with a gradient coil system that is supported in a middle region against the basic field magnet and is adhered in edge regions with the basic field magnet, in accordance with the invention.

FIG. 1 shows as an exemplary embodiment of the invention a longitudinal section through a magnetic resonance device. To generate a static basic magnetic field, the magnetic resonance device thereby has a superconducting basic field magnet 10 with a cavity 12 that is distended like a barrel in a middle region 14 and is cylindrically fashioned in edge regions 16 and 18 that connect to both sides of the middle region 14. The basic field magnet 10 is, for example, designed corresponding to the above-cited German OS 101 56 770.

To generate gradient fields, a gradient coil system 20 is mounted in the cavity 12 of the basic field magnet 10. The gradient coil system 20 is formed by two structurally independent units 22 and 24 shaped as hollow cylinders, each of the units 22 and 24 respectively including also the coils of gradient coils of the gradient coil system 20. Each of the units 22 and 24 thus has saddle-shaped partial coils of a first transversal gradient coil two further saddle-shaped partial coils of a second transversal gradient coil, and a solenoid-like partial coil of a longitudinal gradient coil. The units 22 and 24 thereby correspond, for example, to those described in the above-cited German OS 197 22 211, produced with a typical vacuum flow method.

Furthermore, the gradient coil system 20 has a carrier 26 produced from a glass and/or carbon fiber-reinforced synthetic, in the edge regions of which both units 22 and 24 are attached, separated from one another. The carrier 26 has a passive shim system, for which purpose the carrier 26 is fashioned with corresponding acceptance openings for the insertion of shim carriers filled with ferromagnetic shim elements. The plate-like shim elements are screwed down or adhered to the shim carrier. In another embodiment, the shim elements can be contained in shim boxes.

Furthermore, the carrier 26 has in a middle region 28, four bores 29 distributed in the circumferential direction with a threading to guide the supporting arrangement. The gradient coil system 20 is additionally fixed in the middle region 14 of the cavity 12 via the supporting arrangement 30. The supporting arrangement 30 has four parts distributed in the circumferential direction, each of the parts having a threaded bolt 32 and a pressure plate 34 made of a soft material such as rubber or plastic. The fixing can be set as soft or hard by the fastening torque of the threading bolts 32, dependent on the use of the gradient coil system 20. Transmission of mechanical oscillations that arise from the gradient coil system 20 to the rest of the magnetic resonance device thus can be minimized.

An adhesive 50 that connects the gradient coil system 20 with the basic field magnet 10 via surface bonding is introduced between the outer generated surface of both edge regions of the carrier 26 (in which the units 22 and 24 are attached) and the surface of the basic field magnet 10 directly facing it. Adhesives of various types (thus also polyurethane foams) can be used as the adhesive 50. Physically setting adhesives (for wet bonding, contact bonding, activated bonding and pressure sensitive bonding) and chemically setting adhesives (for reaction bonding, comprising chemically hardening adhesives, for example a hardening resin) are suitable. The aforementioned surfaces are thereby attached in the basic field magnet over a large surface and with positive fit, which increases the stiffness of the installation of the gradient coil system 20.

An adhesive with a melting temperature between approximately 50° C. and 90° C., for example a wax or a similar material with a low melting point, also can be used as adhesive 50. In normal operation of the gradient coil system 20, it is ensured by appropriate control of the currents in the partial coils and a coolant unit (present, if necessary) that a temperature on the outer jacket of the carrier 26 in the region of the units 22 and 24 is sufficiently far from the melting point of the wax used. For non-destructive removal of the units of the gradient coil system 20, it is only necessary to heat the outer jacket of the carrier 26 in the region of the units 22 and 24 above the melting point of the adhesive 50 that is used. For this, suitable currents can be adjusted in the partial coils. In another embodiment, the gradient coil system 20 is provided with an additional heating device. The gradient coil system 20 thus can be reversibly and non-destructively installed and removed.

To transmit radio-frequency signals and receive magnetic resonance signals, a specially fashioned antenna system 40 is provided between the two units 22 and 24 for attachment to the two units 22 and 24.

Figure 2:
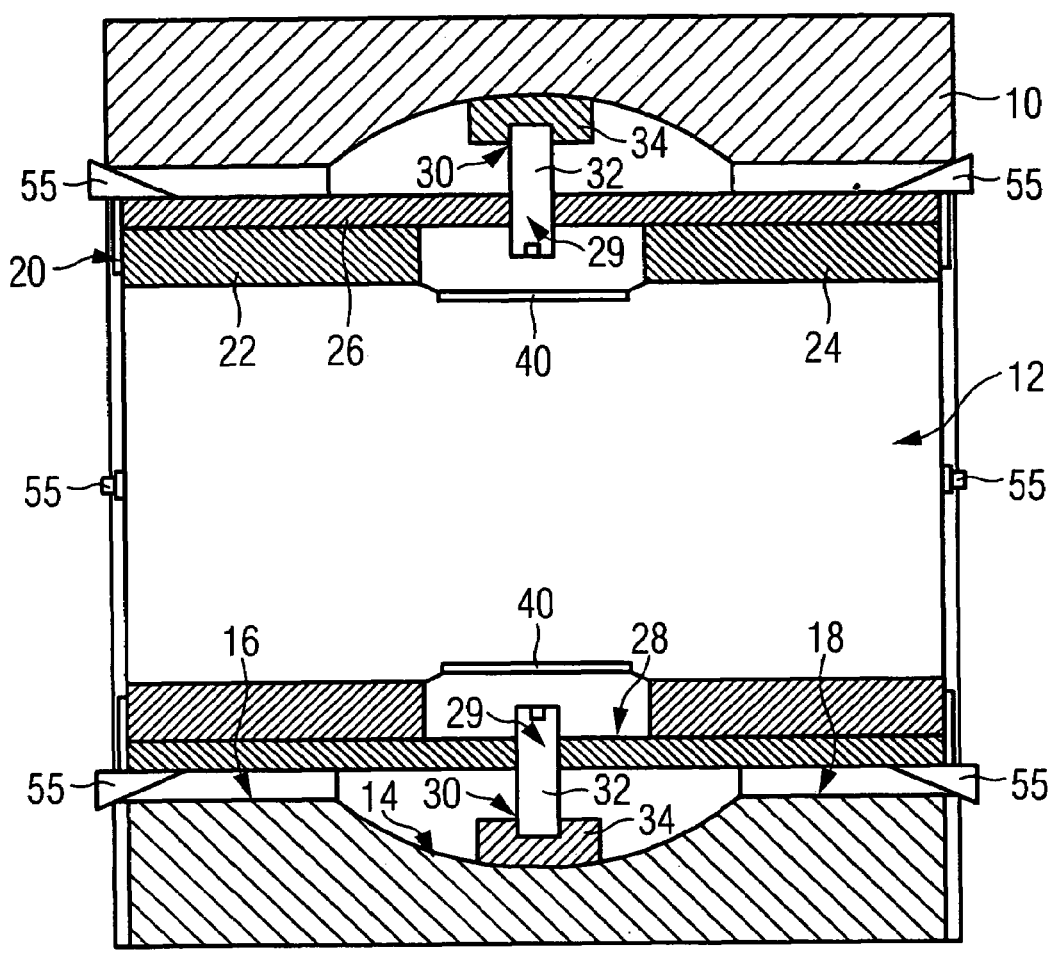
FIG. 2 is a longitudinal section through a magnetic resonance device with a gradient coil system that is supported in a middle region against the basic field magnet and is wedged in edge regions with the basic field magnet in accordance with the invention.

As another exemplary embodiment of the invention, FIG. 2 shows a longitudinal section through a magnetic resonance device that corresponds substantially to that of FIG. 1. In place of the adhesive, however, the edge regions of the gradient coil system 20 are wedged in the cavity 12 by, for example, wedges 55 known from German OS 197 22 481.

Whereas compared to the inventive arrangement, in a conventional installation of the gradient coil system 20, that for example is attached only via the aforementioned wedges 55 and has no supporting arrangement 30, an oscillation of the gradient coil system 20 with lower damping and thus higher noise emission must be expected with due to the gradient coil system 20 being formed in the middle only by the carrier 26 (and thus mechanically weak in that region). Furthermore, in conventional installations the antenna system 40 attached between the units 22 and 24 could thereby be damaged or completely destroyed due to the severe relative motions of the two units 22 and 24, and the carrier 26 in the middle region could even break. These problems are avoided in the inventive installation.

Although modifications and changes may be suggested by those skilled in the art, it is the intention of the inventors to embody within the patent warranted hereon all changes and modifications as reasonably and properly come within the scope of their contribution to the art.

We claim as our invention:

1. A magnetic resonance apparatus comprising:
   a magnetic resonance scanner having a cavity therein configured to receive a subject, said cavity having a boundary surface;
   a gradient coil system disposed in said cavity, said gradient coil system having a middle region and edge regions that are respectively disposed on opposite sides of, and adjoin, said middle region, said middle region having a reduced mechanical stiffness compared to said edge regions; and
   a supporting arrangement, separate from said gradient coil system, supporting said gradient coil system in said cavity, and said supporting arrangement including a central support disposed between said middle region and against said boundary surface of said cavity.

2. A magnetic resonance apparatus as claimed in claim 1, wherein said gradient coil system further comprises a carrier.

3. A magnetic resonance apparatus as claimed in claim 2, wherein said gradient coil system further comprises a plurality of sets of sub-coils that respectively form gradient coils, and said sub-coils in said sets of sub-coils being divided among at least two groups that are disposed on said carrier.

4. A magnetic resonance apparatus as claimed in claim 3, wherein at least one of said two groups of sub-coils is structurally independent.

5. A magnetic resonance apparatus as claimed in claim 3, wherein said two groups of sub-coils in said middle region, are attached to said carrier and separated from each other.

6. A magnetic resonance apparatus as claimed in claim 2 wherein said carrier has a hollow cylindrical shape.

7. A magnetic resonance apparatus as claimed in claim 6, wherein said groups of sub-coils each have a hollow cylindrical shape.

8. A magnetic resonance apparatus as claimed in claim 1 wherein said gradient coil system has a hollow-cylindrical shape.

9. A magnetic resonance apparatus as claimed in claim 1 wherein said cavity, in a region thereof corresponding to said middle region of said gradient coils system, has a barrel shape.

10. A magnetic resonance apparatus as claimed in claim 9 wherein said cavity has cylindrical regions respectively on opposite sides of, and adjoining, said region with said barrel shape.

11. A magnetic resonance apparatus as claimed in claim 1 wherein said scanner comprises a basic field magnet forming said cavity.

12. A magnetic resonance apparatus as claimed in claim 1, wherein said gradient coil system has a circumference, and wherein said support arrangement comprises at least three supporting elements, one of which is said central support, circumferentially distributed around said gradient coil system.

13. A magnetic resonance apparatus as claimed in claim 12, wherein said central support comprises a threaded bolt with a pressure plate facing said boundary surface of said cavity.

14. A magnetic resonance apparatus as claimed in claim 13, wherein said gradient coil system further comprises a carrier having a threaded bore therein in which said threaded bolt is received.

15. A magnetic resonance apparatus as claimed in claim 1 wherein said gradient coil system is attached to said boundary surface of said cavity by an adhesive.

16. A magnetic resonance apparatus as claimed in claim 1 wherein said gradient coil system is wedged in said cavity.

* * * * *